(12) United States Patent
Lin (10) Patent No.: US 9,236,369 B2
(45) Date of Patent: Jan. 12, 2016

(54) BONDED SEMICONDUCTOR STRUCTURES (71) Applicant: Taiwan Semiconductor Manufacturing Co., LTD., Hsinchu (TW)

(72) Inventor: Jing-Cheng Lin, HsinChu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 13/945,243

(22) Filed: Jul. 18, 2013

(65) Prior Publication Data

US 2015/0021786 A1    Jan. 22, 2015

(51) Int. Cl.
*H01L 21/30* (2006.01)
*H01L 25/00* (2006.01)
*H01L 27/06* (2006.01)
*H01L 21/822* (2006.01)
*H01L 25/065* (2006.01)

(52) U.S. Cl.
CPC ............ *H01L 25/50* (2013.01); *H01L 21/8221* (2013.01); *H01L 27/0688* (2013.01); *H01L 25/0657* (2013.01); *H01L 2225/06524* (2013.01); *H01L 2225/06541* (2013.01); *H01L 2225/06565* (2013.01); *H01L 2924/0002* (2013.01)

(58) Field of Classification Search
USPC ......... 438/462, 406, 413, 423, 506, 455–459; 257/E21.088, E21.567, E29.005
See application file for complete search history.

(56) References Cited

U.S. PATENT DOCUMENTS

| | | | | | |
|---|---|---|---|---|---|
| 3,909,332 | A | * | 9/1975 | Yerman | 438/406 |
| 4,897,362 | A | * | 1/1990 | Delgado et al. | 438/406 |
| 8,048,728 | B2 | * | 11/2011 | Yamazaki | 438/164 |
| 8,501,515 | B1 | * | 8/2013 | Pan | 438/48 |
| 2002/0072200 | A1 | * | 6/2002 | Czagas et al. | 438/455 |

* cited by examiner

*Primary Examiner* — Jasmine Clark
(74) *Attorney, Agent, or Firm* — Maschoff Brennan (57) ABSTRACT

A method is disclosed that includes the steps outlined below. A first oxide layer is formed to divide a first semiconductor substrate into a first part and a second part. A second oxide layer is formed on the first part of the first semiconductor substrate. The first oxide layer is bonded to a third oxide layer of a second semiconductor substrate. The second part of first semiconductor substrate and the first oxide layer are removed to expose the first part of the first semiconductor substrate.

20 Claims, 7 Drawing Sheets

BONDED SEMICONDUCTOR STRUCTURES

FIELD

The present disclosure relates to a bonded semiconductor structure.

BACKGROUND

To attain higher performance and lower power consumption of an integrated circuit (IC) device, dimensions of the IC device are minimized. However, minimizing dimensions of the IC device makes it difficult and complicated to manufacture the IC device.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
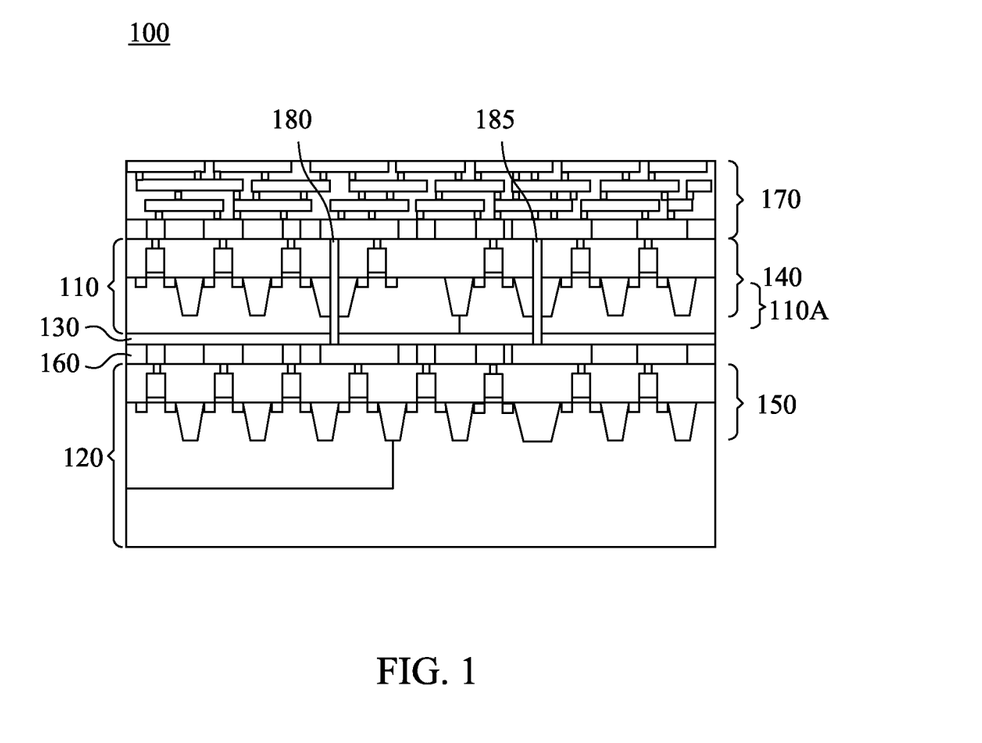
FIG. 1 is a cross sectional view of a semiconductor device in accordance with some embodiments of the present disclosure.

FIG. 1 is a cross sectional view of a semiconductor device 100 in accordance with some embodiments of the present disclosure.

In the semiconductor device 100, a first semiconductor substrate 110 is bonded to a second semiconductor substrate 120 through a bonding oxide layer 130.

The semiconductor substrate 110 includes a substrate portion 110A and a first semiconductor device portion 140 formed thereon. In some embodiment, the semiconductor device portion 140 includes integrated circuit (IC) components (not labeled) such as N-type metal-oxide semiconductor (NMOS) transistors, P-type metal-oxide semiconductor (PMOS) transistors, MOS capacitors, varactors, etc.

A second semiconductor device portion 150 is formed in the semiconductor substrate 120. Similar to the semiconductor device portion 140, the semiconductor device portion 150 includes IC components (not labeled) such as NMOS transistors, PMOS transistors, MOS capacitors, varactors, etc.

An interconnect layer 160 is provided between the semiconductor device portion 150 and the bonding oxide layer 130. The interconnect layer 160 connects different IC components in the semiconductor device portion 150 together. In some embodiments, the interconnect layer 160 includes at least one metal layer (not shown) and corresponding intermetal dielectric (IMD) layers (not shown). The interconnect layer 160 in FIG. 1 is for illustrative purposes. Various numbers and configurations of the metal layers and IMD layers in the interconnect 160 are within the contemplated scope of the present disclosure.

An interconnect layer 170 is formed on the semiconductor device portion 140. The interconnect layer 170 provides a similar function as the interconnect layer 160. Alternatively stated, the interconnect layer 170 connects different components in the semiconductor device portion 140 together. The interconnect layers 160 and 170 are shown differently in FIG. 1 to illustrate different embodiments.

Similar to the interconnect layer 160, the interconnect layer 170 in FIG. 1 is for illustrative purposes. Various numbers and configurations of the metal layers and corresponding IMD layers in the interconnect layer 170 are within the contemplated scope of the present disclosure.

Physically, each of the vias 180 and 185 contacts the interconnect layer 170, penetrates through the semiconductor device portion 140, the substrate portion 110A and the bonding oxide layer 130, and further contacts the interconnect layer 160. Electrically, the vias 180 and 185 connect the semiconductor device portion 140 and the semiconductor device portion 150 through the interconnect layer 170 and the interconnect layer 160. Effectively, the vias 180 and 185 form two electrical conduction paths each beginning from the semiconductor device portion 140, through the interconnect layer 170, the vias 180 and 185, the interconnect layer 160 and to the semiconductor device portion 150. Therefore, the IC components in the semiconductor device portion 140 are connected to the IC components in the semiconductor device portion 150 through the interconnect layer 170 and the interconnect layer 160. Two vias 180 and 185 are shown for illustration. A different number of vias is within the scope of the present disclosure.

In some embodiments, the thickness of the substrate portion 110A is 1-30 micrometers. Compared to the substrate portion having a higher thickness, such as 40-100 micrometers in other approaches, the substrate portion 110A is thin, and thus shortens the distance between the semiconductor device portion 140 and the semiconductor device portion 150. Accordingly, the electrical connections between the semiconductor device portion 140 and the semiconductor device portion 150 in the present disclosure are shortened. As a result, loss of electrical signals transmitted between the semiconductor device portion 140 and the semiconductor device portion 150 is reduced. The electrical performance between the semiconductor device portion 140 and the semiconductor device portion 150 is thus enhanced.

Further, in some embodiments, the diameter of the via 180 and/or 185 in FIG. 1 is less than 4 micrometers. In various embodiments, the diameter of the via 180 and/or 185 in FIG. 1 is less than 2 micrometers. The diameter of the via 180 and/or 185 is various when the via 180 and/or 185 is formed by various processes. The diameter of the via 180 or 185 is smaller than that of a via in other approaches, because the thickness of the substrate portion 110A is thinner, as described above. Compared to a via having a diameter that ranges from 5 to 6 micrometers in other approaches, extrusion caused by the via in other approaches is reduced and/or eliminated because the diameter of the via 180 or 185 in the present disclosure is smaller.

Because the substrate portion 110A is thinner and the vias 180 and 185 are shorter, the parasitic capacitance effect of the vias 180 and 185 is reduced. Because the parasitic capacitance effect is reduced, the diameters of the vias 180 and 185 are afforded to be smaller than those in other approaches. Furthermore, the smaller diameter and shorter length of the vias 180 and 185 result in a smaller volume. Accordingly, stresses caused by the vias 180 and 185 are decreased.

Figure 2:
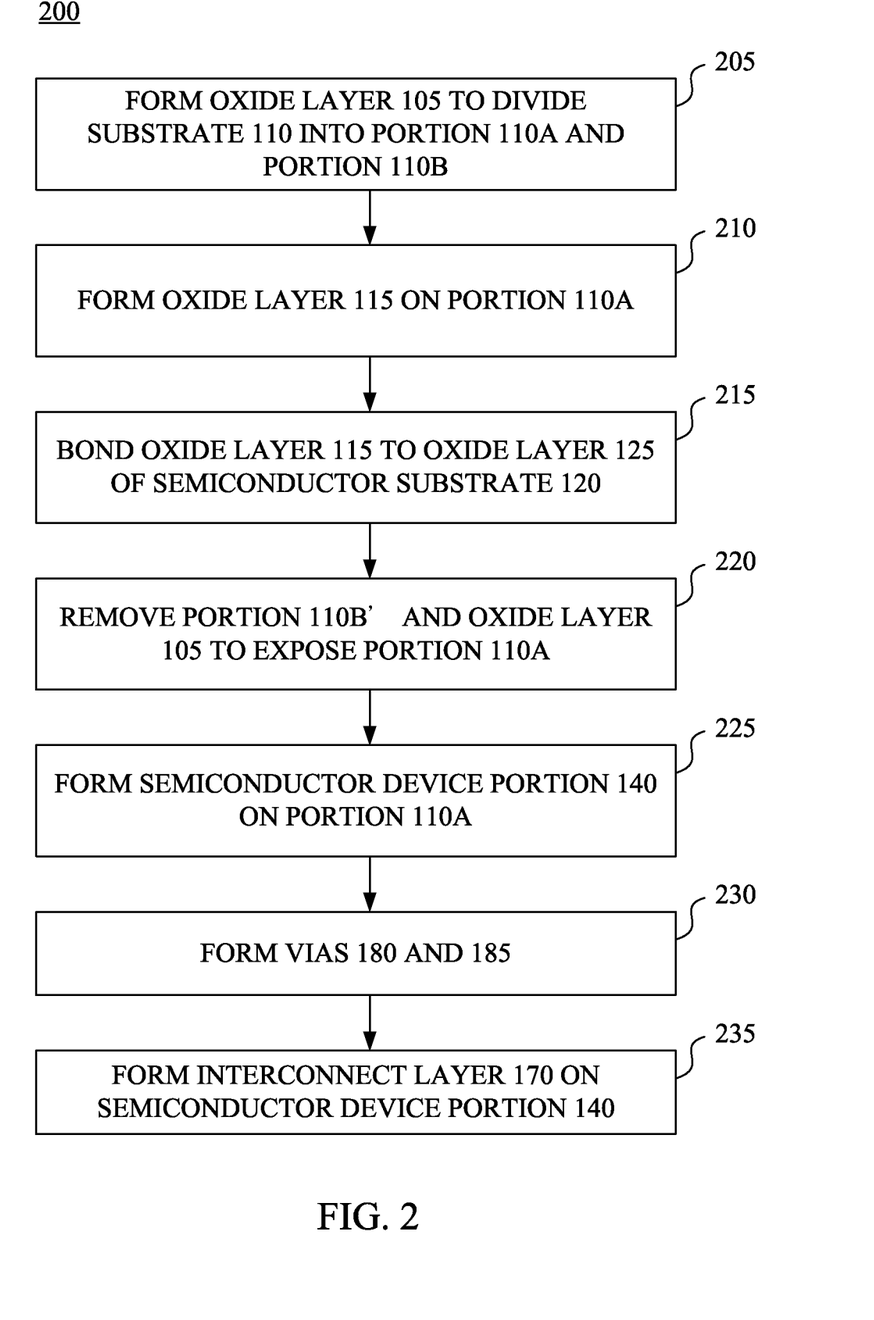
FIG. 2 is a flow chart of a method illustrating the manufacturing process of the semiconductor device in FIG. 1, in accordance with some embodiments of the present disclosure.

FIG. 2 is a flow chart of a method 200 illustrating the manufacturing process of the semiconductor device 100 in FIG. 1, in accordance with some embodiments of the present disclosure. For illustration, the manufacturing process of the semiconductor device 100 in FIG. 1 is described by the method 200 with reference to FIGS. 3A-3G.

FIGS. 3A-3G are cross sectional views of the semiconductor device 100 at different stages of a manufacturing process, in accordance with some embodiments of the present disclosure. After the different stages in FIGS. 3A-3G, the semiconductor device 100 has the cross sectional view in FIG. 1.

Figure 3A:
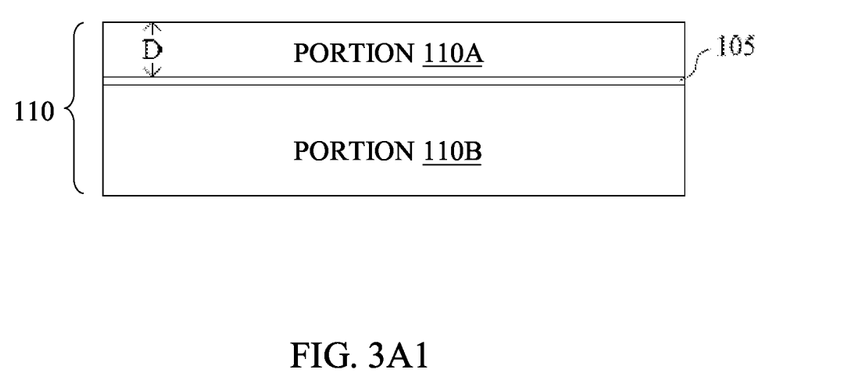
FIGS. 3A-3G are cross sectional views of the semiconductor device in FIG. 1 at different stages of a manufacturing process, in accordance with some embodiments of the present disclosure.

With reference to the method 200 in FIG. 2, in operation 205, an oxide layer 105 is formed to divide a semiconductor substrate 110 into a portion 110A and a portion 110B, as illustrated in FIG. 3A. In some embodiments, the oxide layer 105 is formed by an ion-implantation process, and has a depth D. A value of the depth D depends on a combination of doses of oxygen, ion-implantation energies and temperatures in the ion-implantation processes. In some embodiments, the semiconductor substrate 110 is a silicon (Si) substrate, and, for simplicity, is shown without semiconductor device therein. Other types of substrate are with the contemplated scope of the disclosure.

The oxide layer 105 is formed to protect the portion 110A when the portion 110B is removed in the later step of the manufacturing process. In some embodiments, the oxide layer 105 is formed by implanting oxygen ions (O+) into the semiconductor substrate 110.

Figure 3A:
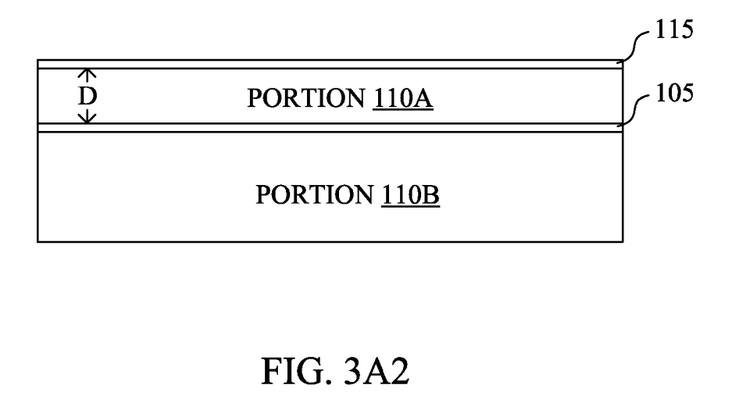

In operation 210, an oxide layer 115 is formed on the portion 110A, as illustrated in FIG. 3A2. The oxide layer 115 is for bonding the semiconductor substrate 120 in the below operation of the manufacturing process. In various embodiments, the thickness of the portion 110A is in the range of 1-30 micrometers. In some embodiments, the thickness of the portion 110A is selected based on various factors, including, for example, cost of manufacturing, capabilities to build semiconductor devices in the portion 110A, etc. For example, if the thickness of the portion 110A increases, the cost of the manufacturing process also increases. On the other hand, if the thickness of the portion 110A decreases to be too thin, forming semiconductor devices in the portion 110A in later operations is difficult.

Figure 3B:
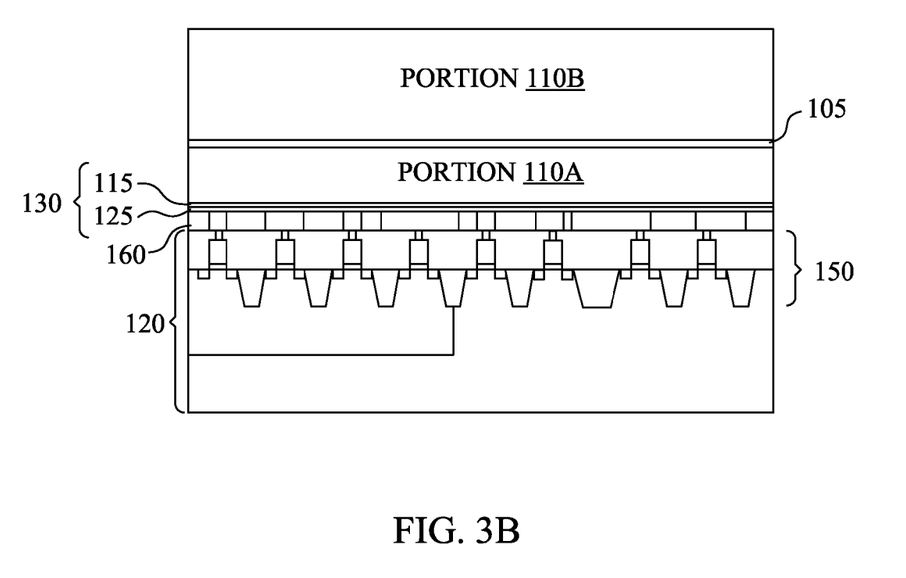

In operation 215, the oxide layer 115 is bonded to an oxide layer 125 of a semiconductor substrate 120, as illustrated in FIG. 3B. The oxide layer 115 and the oxide layer 125 merge as a single bonding oxide layer 130 after they are bonded together. In some embodiments, an interconnect layer 160 is in between the oxide layer 125 and the semiconductor device portion 150.

Figure 3C:
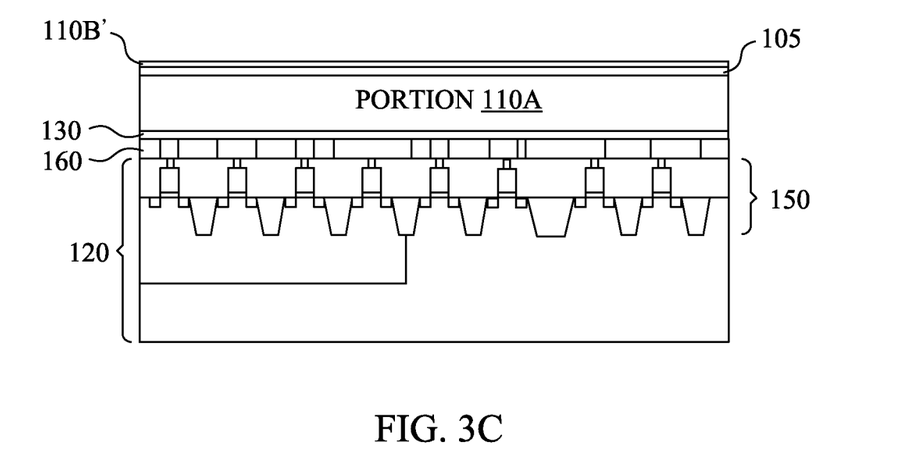

In operation 220, the portion 110B in FIG. 3B is removed. As a result, a remaining portion 110B' is formed, as illustrated in FIG. 3C.

In some embodiments, the portion 110B in FIG. 3B is grinded first. Further, the grinding process is stopped at a certain position above the oxide 105, and the remaining portion 110B' is thus formed, as illustrated in FIG. 3C. In some embodiments, the thickness of the remaining portion 110B' is 1 micrometer. In some other embodiments, the thickness of the remaining portion 110B' is larger than 1 micrometer. In some embodiments, selecting a thickness of the remaining portion 110B' is based on various factors. For example, when the remaining portion 110B' is less than 1 micrometer, precisely controlling the grinding process is difficult and can cause damages to the portion 110A under the portion 110B'. On the other hand, when the thickness of the remaining portion 110B' is larger than 1 micrometer, the subsequent etching process takes longer to remove the remaining portion 110B' and the oxide layer 105.

Figure 3D:
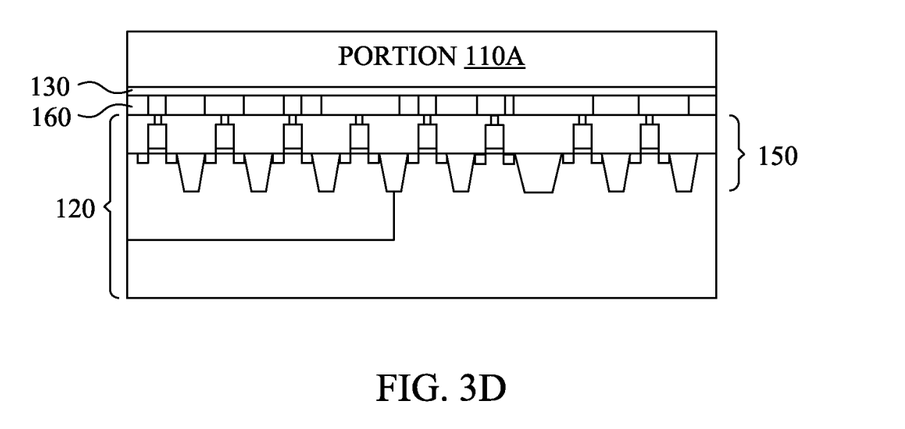

In some embodiments, a subsequent etching process is performed to remove the remaining portion 110B' and the oxide layer 105 to expose the portion 110A, as illustrated in FIG. 3D. Different etching processes, including wet etching or dry etching process, are within the contemplated scope of the present disclosure. Other methods of removing are also within the contemplated scope of the present disclosure.

Figure 3E:
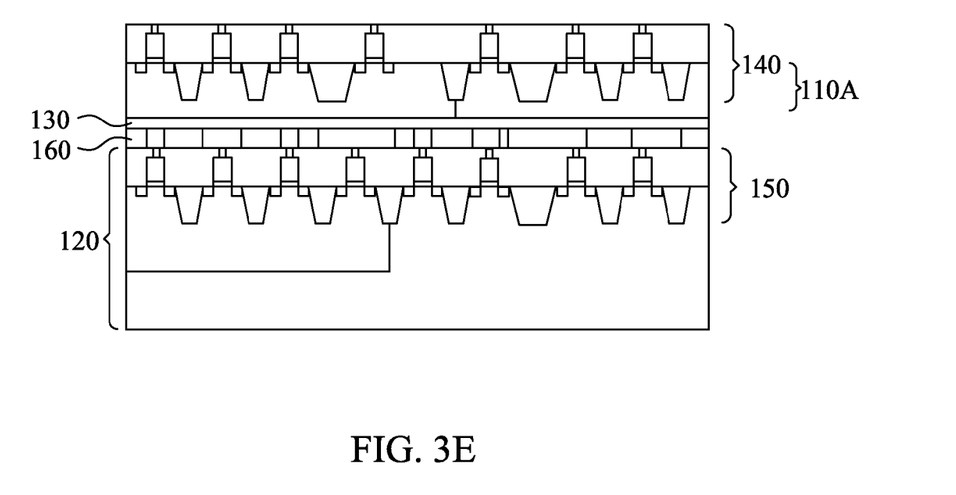

In operation 225, a semiconductor device portion 140 is formed on the portion 110A, as illustrated in FIG. 3E.

Figure 3F:
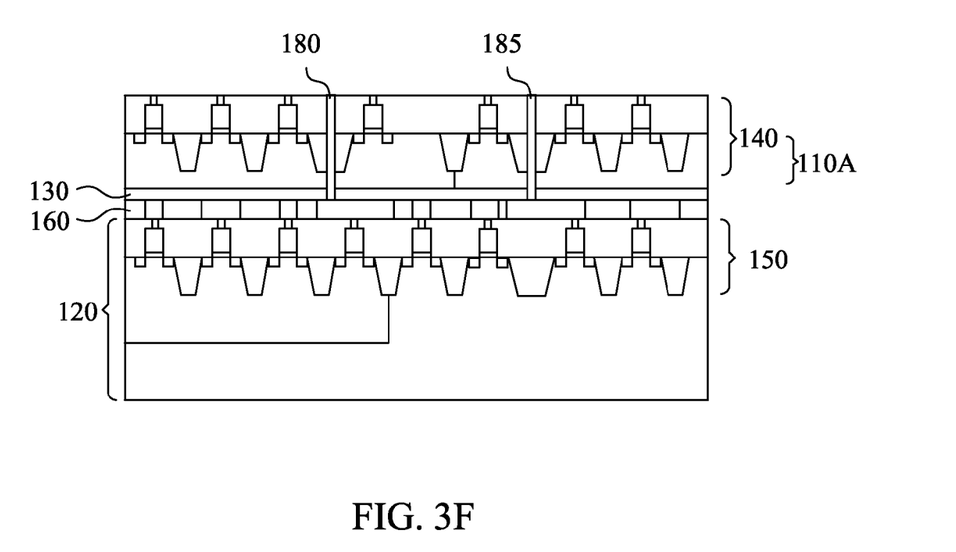

In operation 230, vias 180 and 185 are formed to penetrate through the semiconductor device portion 140, the portion 110A, and the bonding oxide layer 130 to contact the interconnect layer 160, as illustrated in FIG. 3F.

Figure 3G:
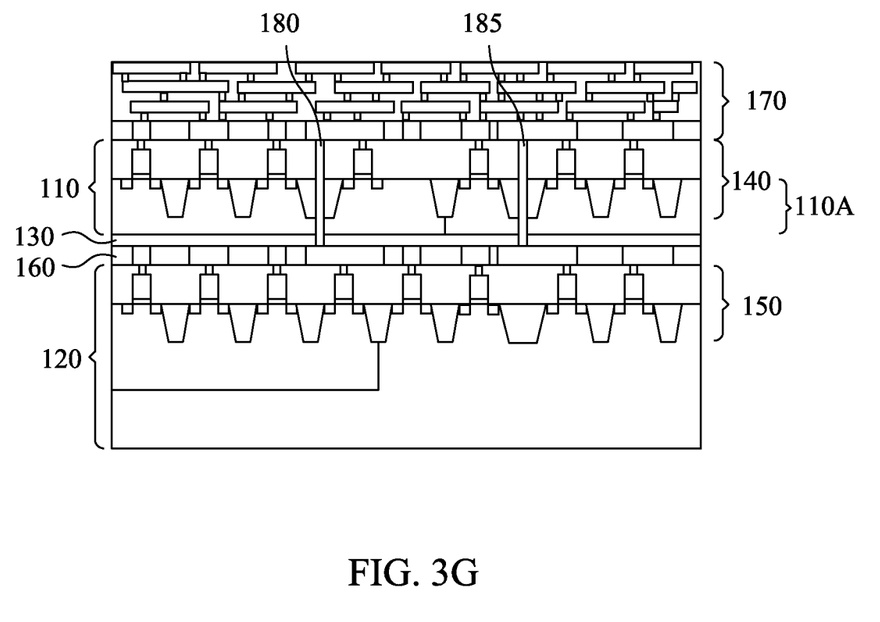

In operation 235, an interconnect layer 170 is formed on the semiconductor device portion 140, as illustrated in FIG. 3G.

The cross sectional view of the semiconductor device 100 in FIG. 3G is the cross sectional view of the semiconductor device 100 in FIG. 1.

In some embodiments, a method is disclosed that includes the operations outlined below. A first oxide layer is formed to divide a first semiconductor substrate into a first part and a second part. A second oxide layer is formed on the first part of the first semiconductor substrate. The first oxide layer is bonded to a third oxide layer of a second semiconductor substrate. The second part of first semiconductor substrate and the inner oxide layer are removed to expose the first part of the first semiconductor substrate.

A method is also disclosed that includes the operations outlined below. A first oxide layer on a first semiconductor substrate is bonded to a second oxide layer of a second semiconductor substrate, in which the first semiconductor substrate is divided into a first part and a second part by a third oxide layer. The second part of the first semiconductor substrate and the third oxide layer are removed to expose the first part of the first semiconductor substrate. A first semiconductor device portion is formed on the first part of the first semiconductor substrate. An interconnect layer is formed on the first semiconductor device portion.

Also disclosed is a semiconductor device including a first semiconductor substrate, a second semiconductor substrate, and an oxide layer for bonding the first semiconductor substrate and the second semiconductor substrate.

In this document, the term "connected" may be termed as "electrically connected", and the term "coupled" may be termed as "electrically coupled". "Connected" and "coupled" may also be used to indicate that two or more elements cooperate or interact with each other.

The above illustrations include exemplary operations, but the operations are not necessarily performed in the order shown. Operations may be added, replaced, changed order, and/or eliminated as appropriate, in accordance with the spirit and scope of various embodiments of the present disclosure.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A method, comprising:
   forming a first oxide layer to divide a first semiconductor substrate into a first part and a second part;
   forming a second oxide layer on the first part of the first semiconductor substrate;
   bonding the second oxide layer to a third oxide layer of a second semiconductor substrate; and
   removing the second part of first semiconductor substrate and the first oxide layer to expose the first part of the first semiconductor substrate.

2. The method of claim 1, further comprising:
   forming a first semiconductor device portion on the first part of the first semiconductor substrate.

3. The method of claim 1, wherein removing the second part of substrate and the first oxide layer comprises:
   grinding the second part of substrate; and
   etching the remaining of the second part of substrate and the first oxide layer to expose the first part of substrate.

4. The method of claim 3, wherein the remaining of the second part of the first semiconductor substrate has a thickness less than 1 micrometer.

5. The method of claim 1, wherein a thickness of the exposed first part of the first semiconductor substrate is in the range of 1-30 micrometers.

6. The method of claim 2, wherein the second semiconductor substrate comprises a second semiconductor device portion.

7. The method of claim 6, wherein the second semiconductor device portion is capped by the third oxide layer.

8. The method of claim 6, further comprising:
   forming at least one via through the first semiconductor device portion and the third oxide layer, for connecting the first semiconductor device portion and the second semiconductor device portion.

9. The method of claim 8, further comprising:
   forming an interconnect layer on the first semiconductor device portion.

10. The method of claim 8, wherein a diameter of the at least one via is less than 4 micrometers.

11. The method of claim 9, wherein the at least one via connects the second semiconductor device portion through a metal layer formed between the second semiconductor device portion and the third oxide layer.

12. The method of claim 1, wherein the first oxide layer is formed by an oxygen implantation process.

13. The method of claim 6, wherein a first interconnect layer is in between the third oxide layer and the second semiconductor device portion, and the method further comprises:
    forming at least one via through the first semiconductor device portion and the third oxide layer; and
    forming a second interconnect layer on the first semiconductor device portion, wherein the at least one via contacts the first interconnect layer and the second interconnect layer.

14. A method, comprising:
    bonding a first oxide layer on a first semiconductor substrate to a second oxide layer of a second semiconductor substrate, wherein the first semiconductor substrate is divided into a first part and a second part by a third oxide layer;
    removing the second part of the first semiconductor substrate and the third oxide layer to expose the first part of the first semiconductor substrate;
    forming a first semiconductor device portion on the first part of the first semiconductor substrate;
    forming at least one via through the first semiconductor device portion and the second oxide layer; and
    forming an interconnect layer on the first semiconductor device portion.

15. The method of claim 14, wherein removing the second part of the first semiconductor substrate and the third oxide layer comprises:
    grinding the second part of the first semiconductor substrate; and
    etching the remaining of the second part of the first semiconductor substrate and the third oxide layer to expose the first part of the first semiconductor substrate.

16. The method of claim 15, wherein etching the remaining of the second part of the first semiconductor substrate and the third oxide layer is performed by wet-etching or dry-etching.

17. The method of claim 14, wherein the remaining of the second part of the first semiconductor substrate has a thickness less than 1 micrometer.

18. The method of claim 14, wherein a thickness of the exposed first part of the first semiconductor substrate is in the range of 1-30 micrometers.

19. The method of claim 14, wherein a diameter of the at least one via is less than 4 micrometers.

20. The method of claim 14, wherein the at least one via contacts the interconnect layer.

* * * * *